(12) United States Patent
Brun et al.

(10) Patent No.: US 7,563,703 B2
(45) Date of Patent: Jul. 21, 2009

(54) MICROELECTRONIC INTERCONNECT DEVICE COMPRISING LOCALISED CONDUCTIVE PINS

(75) Inventors: Jean Brun, Champagnier (FR); Remi Franiatte, Grenoble (FR); Christiane Puget, Saint Egreve (FR)

(73) Assignee: Commissariat a l'Energie Atomique, Paris (FR)

( * ) Notice: Subject to any disclaimer, the term of this patent is extended or adjusted under 35 U.S.C. 154(b) by 246 days.

(21) Appl. No.: 10/590,412

(22) PCT Filed: Feb. 24, 2005

(86) PCT No.: PCT/FR2005/050123

§ 371 (c)(1),
(2), (4) Date: Aug. 23, 2006

(87) PCT Pub. No.: WO2005/086232

PCT Pub. Date: Sep. 15, 2005

(65) Prior Publication Data

US 2007/0166978 A1 Jul. 19, 2007

(30) Foreign Application Priority Data

Feb. 25, 2004 (FR) ................................. 04 50349

(51) Int. Cl.
*H01L 21/445* (2006.01)
(52) U.S. Cl. .................. 438/613; 438/106; 438/108; 438/612; 438/614; 257/E21.479
(58) Field of Classification Search ............... 438/612; 257/E21.479
See application file for complete search history.

(56) References Cited

U.S. PATENT DOCUMENTS

| | | | | |
|---|---|---|---|---|
| 5,457,879 A * | 10/1995 | Gurtler et al. | ............... | 438/108 |
| 5,550,068 A * | 8/1996 | Hirano et al. | ............... | 438/571 |
| 5,731,636 A | 3/1998 | Chun | | |
| 5,746,927 A | 5/1998 | Hashimoto et al. | | |
| 5,977,642 A | 11/1999 | Appelt et al. | | |
| 6,256,874 B1 | 7/2001 | Appelt et al. | | |
| 6,537,854 B1 | 3/2003 | Chang et al. | | |
| 6,841,872 B1 * | 1/2005 | Ha et al. | ..................... | 257/736 |
| 6,959,856 B2 * | 11/2005 | Oh et al. | ..................... | 228/245 |
| 7,015,590 B2 * | 3/2006 | Jeong et al. | ................. | 257/780 |
| 7,026,239 B2 | 4/2006 | Souriau et al. | | |
| 7,214,604 B2 * | 5/2007 | Kim et al. | .................. | 438/613 |
| 2002/0164840 A1 * | 11/2002 | Lu et al. | ..................... | 438/129 |
| 2002/0190107 A1 | 12/2002 | Shah et al. | | |
| 2006/0160270 A1 | 7/2006 | Brun et al. | | |

FOREIGN PATENT DOCUMENTS

| | | |
|---|---|---|
| DE | 101 57 205 | 6/2003 |
| DE | 101 57 205 A1 | 6/2003 |
| WO | 03 015153 | 2/2003 |

* cited by examiner

*Primary Examiner*—Alexander G Ghyka
*Assistant Examiner*—Angel Roman
(74) *Attorney, Agent, or Firm*—Oblon, Spivak, McClelland, Maier & Neustadt, P.C.

(57) ABSTRACT

A method producing conductive rods localized on conductive blocks of an electronic component.

15 Claims, 6 Drawing Sheets

MICROELECTRONIC INTERCONNECT DEVICE COMPRISING LOCALISED CONDUCTIVE PINS

FIELD OF THE INVENTION

The present invention relates to the assembly of electronic components (chips, integrated circuits, electromechanical components, optoelectronic components). There are several categories of techniques to connect chips or integrated circuits to interconnection substrates: "wire-bonding" or micro-wiring, the so-called "flip-chip" bead connection technique and the ACF technique for anisotropic conductive films. The present invention is similar to the ACF technique and relates to a microelectronic device comprising an electronic component equipped with localised conductive rods on some zones thereof and capable of providing an electrical connection with another electronic component with which said component is liable to be assembled. The present invention also relates to a method to produce said microelectronic device.

STATE OF THE PREVIOUS ART

Providing an electrical connection between the conductive blocks of an electronic component, for example a chip and other conductive blocks of another electronic component, for example an interconnection substrate, using an ACF film (or "Anisotropic Conductive Film"), placed between the electronic component and the other electronic component, is known.

An anisotropic conductive film is generally formed from conductive particles incorporated in an insulating layer or metal rods passing through an insulating film. This type of film is used to create an electrical contact generally in an orthogonal direction to its main plane, while ensuring electrical insulation in directions parallel to said main plane.

FIG. 1 illustrates the assembly between a chip 10 and an interconnection substrate 20. The substrate referenced 20 comprises metal-based connection blocks 21 and is coated with adhesive 30 in order to be assembled with the chip 10. The chip 10 is coated on one face with a passivation layer 11 displaying openings revealing conductive blocks 12. The electrical connection between the chip 10 and the substrate 20 will be produced by means of an anisotropic conductive film 15 according to the prior art, formed directly on the chip 10, and resting on the passivation layer 11. This anisotropic conductive film 15 is formed from a plurality of conductive rods 16 passing through an insulating layer 17. The conductive rods 16 will be used after assembly to connect each conductive block of the chip 10 electrically to one or more connection blocks of the substrate 20.

The anisotropic conductive film 15 is suitable for high-density block connections and makes it possible to avoid soldering between connection blocks of the substrate and conductive blocks of the chip. With this type of film, it is not necessary to localise the blocks of the chip and those of the substrate that are to be interconnected.

However, particularly due to the rigidity of the conductive rods, an anisotropic conductive film may prove to be difficult to adapt to the assembly of components displaying significant contact height variations. In this way, using an anisotropic conductive film to interconnect the electronic components comprising significant surface evenness defects is liable to induce difficulties during the assembly of said components.

An anisotropic conductive film may also prove to be unsuitable for interconnecting electronic component comprising one or more sensitive or fragile zones, that should be protected from any shocks or any contact. An anisotropic conductive film as described above comprises conductive rods incorporated regularly throughout an insulating layer. In this way, if an anisotropic conductive film is formed on a component comprising one or more sensitive zones, conductive rods of the anisotropic conductive film may come into contact with one or more of the sensitive zones of the component and cause the damage thereof. In another case in which an anisotropic conductive film is formed on a component and assembled with another component comprising one or more other sensitive zones, conductive rods of the anisotropic conductive film may come into contact with one or more of said other sensitive zones of the component and cause damage thereof.

The problem arises of being able to interconnect electronic components displaying significant surface evenness defects and/or electronic components comprising some sensitive or fragile zones to be protected.

DESCRIPTION OF THE INVENTION

The present invention does not involve the drawbacks of conventional anisotropic conductive films. Its purpose is to propose a microelectronic device, which unlike ACF films according to the prior art, adapts well to the interconnection of electronic components displaying an uneven topography. The present invention also makes it possible to be able to interconnect an electronic component with another electronic component while protecting any sensitive zones located on said component and/or on said other electronic component.

The present invention relates to a method to produce conductive rods on an electronic component comprising one or more conductive blocks, each of the conductive rods being in at least partial contact with a block of the electronic component, comprising the following steps:
  deposition of a conductive base on said component,
  deposition of a masking layer on said conductive base,
  formation in said masking layer of a plurality of holes,
  filling of holes with a conductive material base, by means of electrolysis and using the conductive base as an electrode, in order to form the conductive rods,
  removal of the masking layer.

According to another definition, the invention relates to a method to produce conductive rods on an electronic component comprising one or more conductive blocks, comprising the following steps:
  deposition of a conductive base on said component,
  deposition of a masking layer on said conductive base,
  formation in said masking layer of a plurality of holes,
  filling of holes with a conductive material base, by means of electrolysis and using the conductive base as an electrode, in order to form the conductive rods,
  removal of the masking layer, the method also comprising:
    at least one conductive base insulation step, excluding zones located opposite the conductive blocks.

The present invention particularly relates to a method to produce conductive rods on an electronic component comprising one or more conductive blocks, each of the conductive rods being in at least partial contact with a block of the electronic component, comprising the following steps:
  deposition of a conductive base on said component,
  deposition of a masking layer on said conductive base,
  formation in said masking layer of a plurality of holes, each hole being at least partially located opposite a conductive block, filling of holes with a conductive material base, by means of electrolysis and using the conductive base as an electrode, in order to form the conductive rods, removal of the masking layer.

The masking layer may be formed from at least one photosensitive resin or polymer layer.

The hole formation step in the masking layer may be performed using at least one photolithography method during which the masking layer is exposed to radiation, such as ultraviolet, via a mask comprising one or more patterns impervious to said radiation. During the exposure step, the patterns of the mask may be positioned according to the location of the conductive blocks on the component.

The conductive base may be formed from a conductive layer or a stack of at least two different conductive layers, one of the two layers, for example a Ti-based layer, possibly serving as an adherence adaptation layer, for example.

After the masking layer removal step, an at least partial conductive base removal step may be provided.

According to one specific embodiment, the method may also comprise, after the hole filling step, an additional noble metal-based chemical deposition step on the conductive rods. This step may make it possible to form conductive rods showing improved conductance.

The present invention also relates to a method to produce conductive rods on an electronic component comprising one or more conductive blocks, each of the conductive rods being in at least partial contact with a block of the electronic component comprising the following steps:

deposition of a conductive base on said component, deposition of a masking layer on said conductive base, formation in said masking layer of a plurality of holes, at least one conductive block of said conductive blocks being located opposite one or more holes, at least one hole of said holes having none of said conductive blocks opposite it, etching of the conductive base via the holes, filling of holes with a conductive material base, by means of electrolysis and using the conductive base as an electrode, in order to form the conductive rods, removal of the masking layer.

The hole formation step in the masking layer may be performed by means of a photolithography method during which the masking layer, for example based on photosensitive resin is exposed to radiation, such as ultraviolet, via a mask comprising one or more patterns, some of which are impervious to said radiation.

Advantageously, during the masking layer exposure step, the mask patterns may be positioned with reference to said component, without accounting for the location of the conductive blocks on said component. In this way, an alignment of the mask patterns with the conductive blocks of the component, performed directly or indirectly via marks or designs on the electronic component is not mandatory.

The mask used for the hole formation step in the masking layer may then be selected independently from said electronic component and may be used for several electronic components of different topographies or of different types or wherein the conductive block distribution is different.

Said conductive base may be formed from a conductive layer for example based on copper or a stack of at least two different conductive layers.

The conductive base etching step may be extended so that the holes comprise a first part on the masking layer and a second part on the conductive base, said second part being wider than said first part. In this way, over-etching of the conductive base via the holes may inhibit or prevent the growth of conductive rods in some holes which are not located opposite conductive blocks.

The method may also comprise, after the masking layer removal step, a removal step of said etched conductive base.

The present invention also relates to a method to produce conductive rods on an electronic component comprising one or more conductive blocks, each of the conductive rods being in at least partial contact with a block of the electronic component, comprising the following steps:

deposition of a conductive base on said component, deposition of a thin insulating layer, for example based on photosensitive resin or polymer on the conductive base, formation of a plurality of openings in said thin insulating layer, each opening being located opposite a conductive block.

deposition of a masking layer, formation in said masking layer of a plurality of holes, at least one conductive block of said conductive blocks being located opposite one or more holes, at least one hole of said holes having none of said conductive blocks opposite it, filling of holes with a conductive material base, by means of electrolysis and using the conductive base as an electrode, in order to form the conductive rods, removal of the masking layer.

According to this alternative embodiment of the method, of the plurality of holes formed in the hole formation step in the masking layer, some holes may reveal the thin insulating layer, some other holes may reveal the conductive base.

This alternative embodiment of the method may also comprise after the masking layer removal step, a selective etching or selective conductive base removal step.

The electronic component using which the method according to the invention is performed may for example be a chip or an integrated circuit or a MEMS (electromechanical system) and may be coated with a passivation layer or a dielectric layer wherein said conductive blocks whereon the conductive rods are formed are incorporated.

The invention also relates to a microelectronic device liable to be obtained using the method according to the invention.

The invention also relates to a microelectronic device comprising:

an electronic component coated with one or more conductive blocks and comprising one or more conductive rods or cylindrical conductive protrusions or cylindrical conductive protuberances each attached to said electronic component by one end in at least partial contact with said conductive blocks, the other end being capable of coming into contact with a contact zone or a connection block of another electronic component positioned opposite one of said conductive blocks.

The conductive rods may be rectilinear.

They may be between 1 μm and 15 μm in diameter, for example. They may be between 4 μm and 30 μm long, for example.

The number of rods per conductive block of the component may be between 5 and 1000, for example.

According to an advantageous embodiment of the present invention, the electronic component may comprise at least one conductive block in at least partial contact with no less than 2 rods.

BRIEF DESCRIPTION OF THE DRAWINGS

The present invention will be understood more clearly on reading the description of embodiment examples given solely as an indication and in no way exhaustively, with reference to the appended figures wherein.

Figure 1:
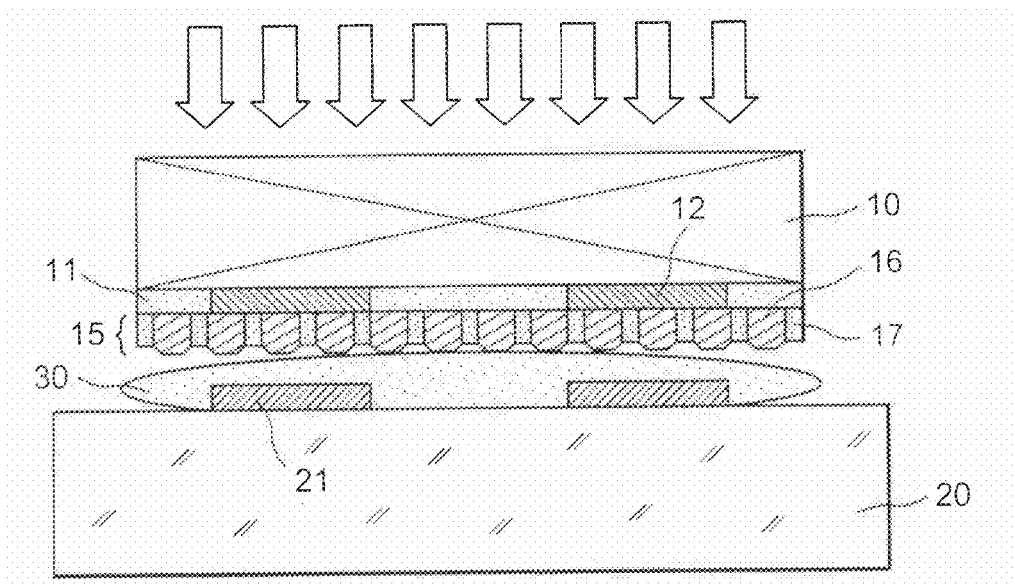
FIG. 1 already described represents the interconnection of a chip and a substrate according to the prior art using an anisotropic conductive film.

Identical, similar or equivalent parts of the different figures contain the same numeric references so as to facilitate the transition between figures. The different parts represented in the figures are not necessarily represented according to a uniform scale, to render the figures more legible.

DETAILED DESCRIPTION OF SPECIFIC EMBODIMENTS

The microelectronic device used according to the invention is formed from a base which may be an integrated circuit, chip, interconnection substrate, or any type of electronic component to be interconnected with another electronic component.

The term electronic component is also intended to include electromechanical component such as MEMS (electromechanical microsystems) or optoelectronic components.

A first example of a method to produce a microelectronic device used according to the present invention is illustrated in FIGS. 2A to 2F.

The first step of this method (FIG. 2A) consists of depositing a conductive layer or a conductive base 105 on a base, for example a chip or interconnection substrate 100 comprising on the surface one or more conductive blocks 102. The conductive blocks 102 may be formed from a conductive metal base, such as nickel, aluminium, tungsten, copper. The conductive layer 105 may be produced by depositing a layer with a metal material base, such as titanium, copper, nickel, tungsten, etc. This layer is particular intended to serve as an electrical current supply layer during the electrolytic growth of subsequently formed conductive rods.

A layer of photosensitive resin 106 (e.g. a polyimide layer around ten micrometers thick) is then deposited on the conductive layer 105. The photosensitive resin layer 106 is exposed via a mask 150 comprising openings 151 and impervious parts 152, the openings 151 and the impervious parts 152 forming a design (FIG. 2B). During the exposure step, the openings 151 and the impervious parts 152 of the mask 150 are arranged according to the location of the conductive blocks 102.

Figure 2A:
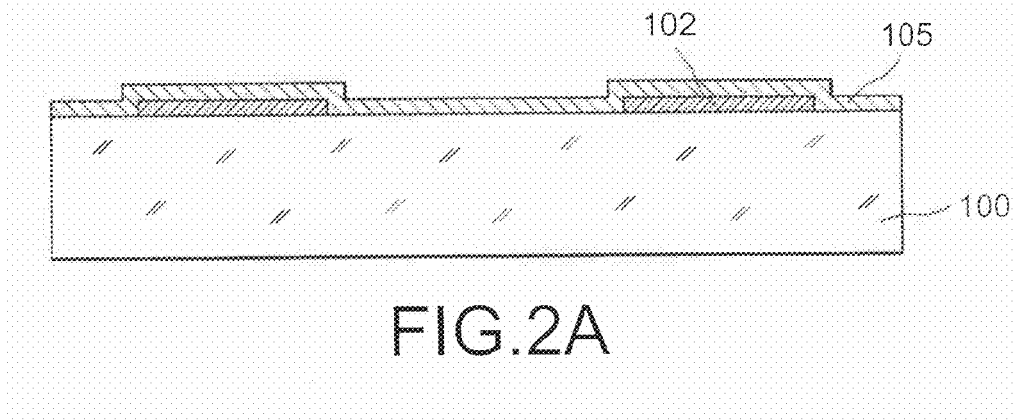
FIGS. 2A-2F represent different steps of a production method according to the invention.
Figure 2B:
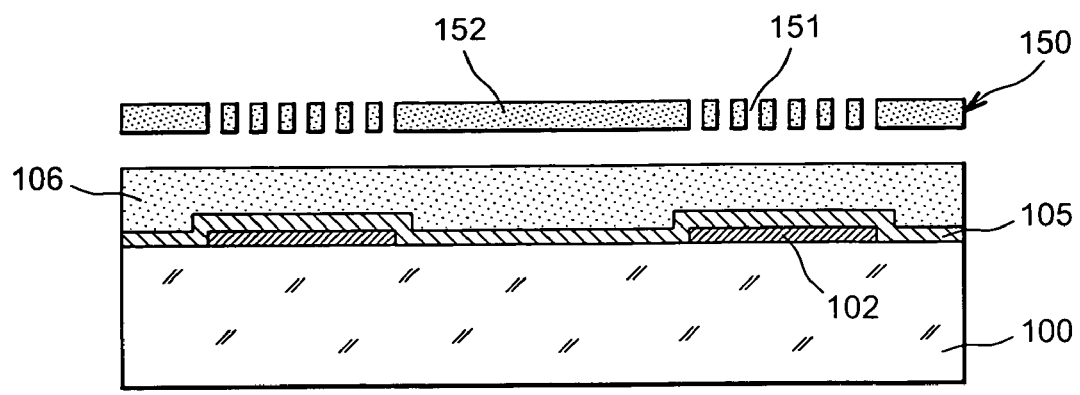
Figure 2C:
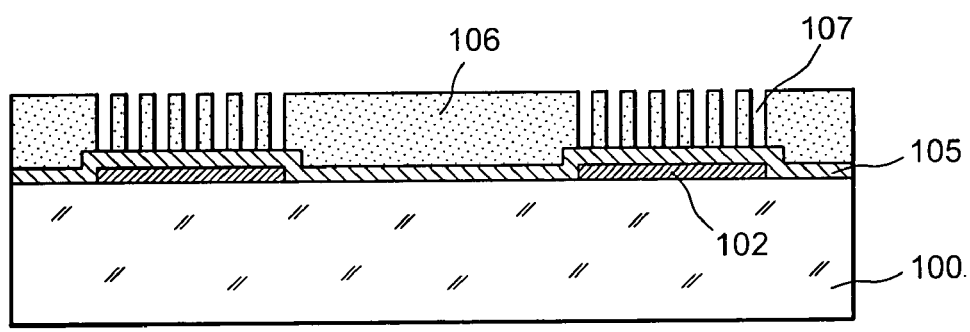

The resin layer 106 is then developed for example using a strong base so as to produce transverse holes 107 in said resin layer 106, the holes 107 revealing the conductive base 105 (FIG. 2C). The holes 107 are grouped into zones arranged opposite the conductive blocks 102 of the substrate 100. Each hole is located at least partially opposite a conductive block.

Figure 2D:
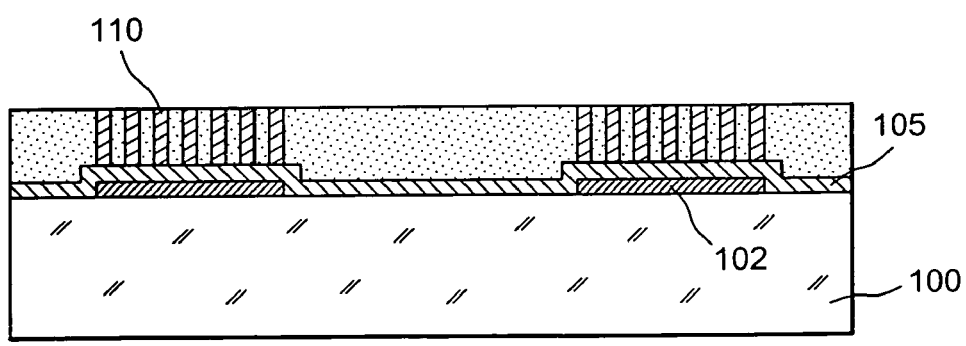
Figure 2E:
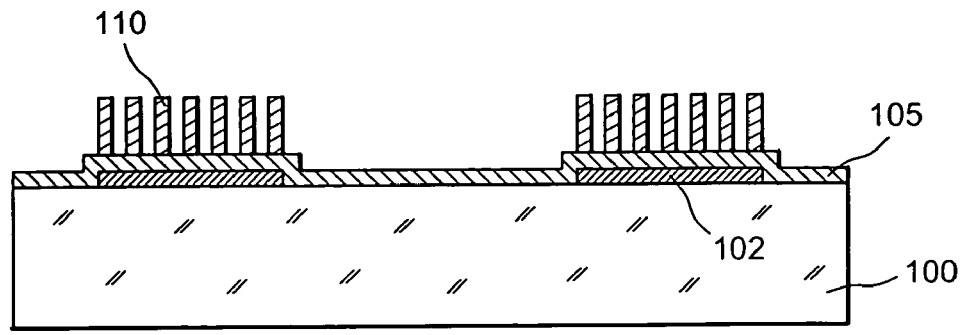

Then, for example by means of electrolytic growth of metal such as copper, nickel, titanium, tungsten, SnPb alloy, gold, etc. using the conductive layer 105 as an electrode, the holes 107 of the perforated layer 106 are filled so as to form conductive rods 110 from the base of the holes 107 located on the conductive layers 105 to the surface of the perforated layer 106 (FIG. 2D).

Figure 2F:
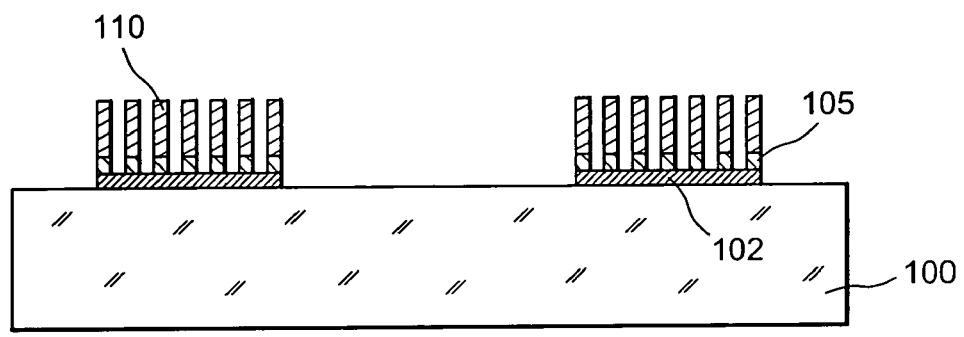

The perforated layer 106 (FIG. 2E) is then removed for example by dissolving the photosensitive resin layer. The conductive layer 105 is then etched selectively apart from under the conductive rods 110 (FIG. 2F).

Therefore, the conductive rods 110 formed in this way on the chip 100 are grouped into zones and are localised on the conductive blocks 102, so that each conductive rod is in at least partial contact with a conductive block.

According to an alternative embodiment of the embodiment example described above, after the deposition step of the conductive layer 105 illustrated in FIG. 2A, a thin insulating layer 103, for example with a photosensitive resin or polymer base and of the order of 1 to 3 micrometers thick, may be deposited. The thin photosensitive resin layer 103 is then exposed to radiation such as ultraviolet via a first mask (not shown) used to expose only the parts of the thin resin layer 103 located opposite the blocks 102, in the case of positive development resin, or expose the entire layer 103 apart from the parts located opposite the blocks 102, in the case of negative development resin.

Figure 3A:
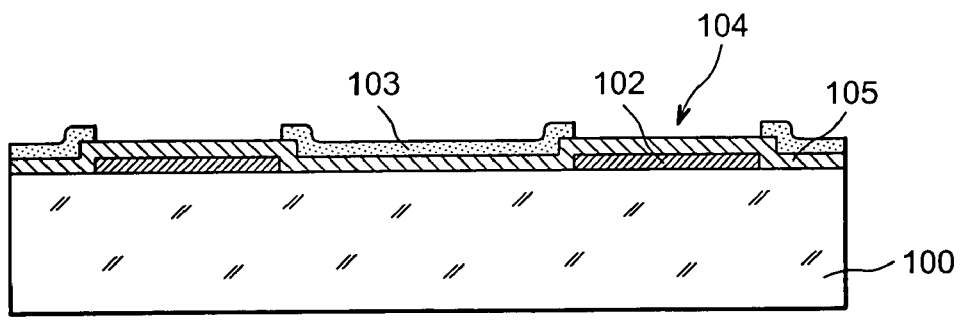
FIGS. 3A-3C represent an alternative embodiment of a production method according to the invention.

The thin resin layer 103 is then developed so as to produce slots or openings 104 located opposite the conductive blocks 102 and revealing the conductive layer 105 (FIG. 3A).

Figure 3B:
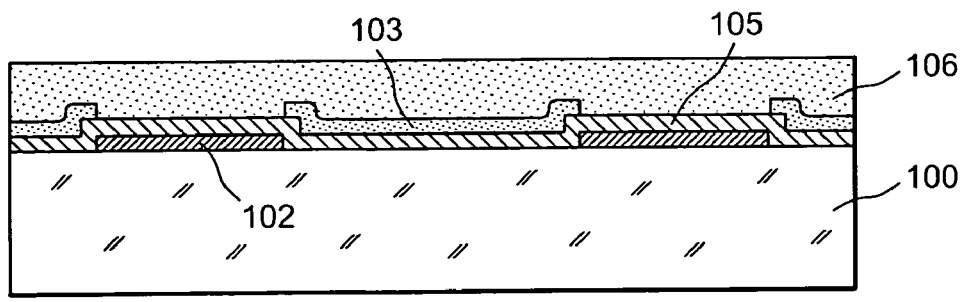

Another photosensitive resin layer 106 (e.g. a polyimide layer around ten micrometers thick) is then deposited on the thin perforated layer 103 (FIG. 3B). The photosensitive resin layer 106 is then exposed via a second mask (not shown) comprising openings and impervious parts arranged according to the location of the conductive blocks 102.

Figure 3C:
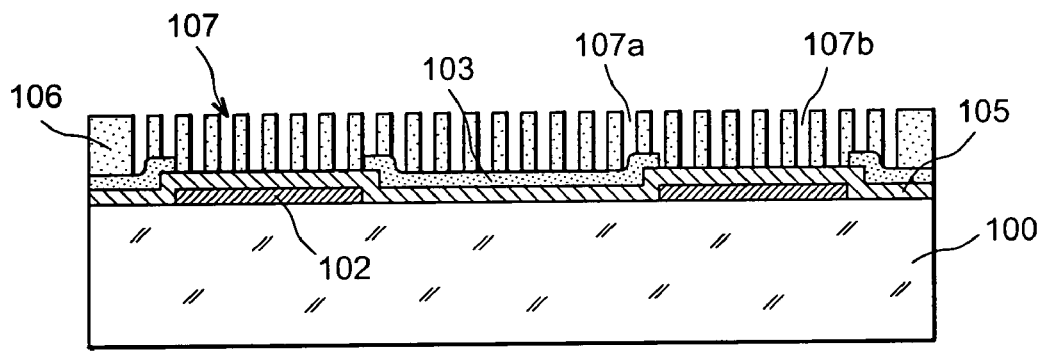

The resin layer 106 is then developed so as to produce a perforated layer comprising holes 107 grouped into zones arranged above the conductive blocks. Some holes 107b are located opposite blocks and reveal the conductive layer 105. Some other holes 107a, wherein the base reveals the thin resin layer 103 are not located opposite any of the blocks 102 (FIG. 3C).

The steps of the example of the method described above illustrated in FIGS. 2D to 2F are then followed. The holes 107b are filled by means of electrolysis using the conductive base 105 as an electrode to form conductive rods. The holes 107a, wherein the base reveals the thin resin layer 103 are not filled.

The thin resin layer 103 and the other resin layer 106 are then removed. Finally, the conductive layer 105 is etched selectively, so that said layer is only retained under the conductive rods 110.

Another example of a method to produce a microelectronic device used according to the present invention will now be described with reference to FIGS. 4A-4E.

In this alternative embodiment, the microelectronic device according to the invention is formed from a chip 300, comprising conductive blocks 302 with a metal base such as copper, inserted in a passivation layer 304 with a dielectric base such as $SiO_2$.

In this example of the method, a continuous conductive base 305 is firstly deposited on the chip 300 and covers the conductive blocks 302 and the passivation layer 304. The continuous conductive base 305 may be formed from a conductive layer or a stack of several conductive layers. Such a stack may be formed for example from a first conductive layer, such as a titanium-based layer of the order of 300 Angstrom in thickness, coated with a second conductive layer, for example with a copper base and of the order of 2500 Angstrom in thickness.

The deposition of a layer 306 with a photosensitive resin or polymer base, e.g. a layer of Chipley SJR 5740 resin (registered trademark) around ten micrometers thick is then performed on the base 300.

A photolithography method is then performed in order to form a plurality of holes in the layer 306. During this photolithography method, the layer 306 is firstly exposed to radiation such as ultraviolet via a mask (not shown) comprising patterns impervious to said radiation. Said patterns may be identical and distributed regularly on the mask. They are preferentially separated by a constant interval.

The exposure of the layer 306 may be performed without aligning the mask patterns with one or more designs, reference points or alignment marks of any kind located on the chip 300.

In this way, direct or indirect alignment of the mask patterns with the conductive blocks 302 of the chip 300 is not necessary, for example.

Figure 4A:
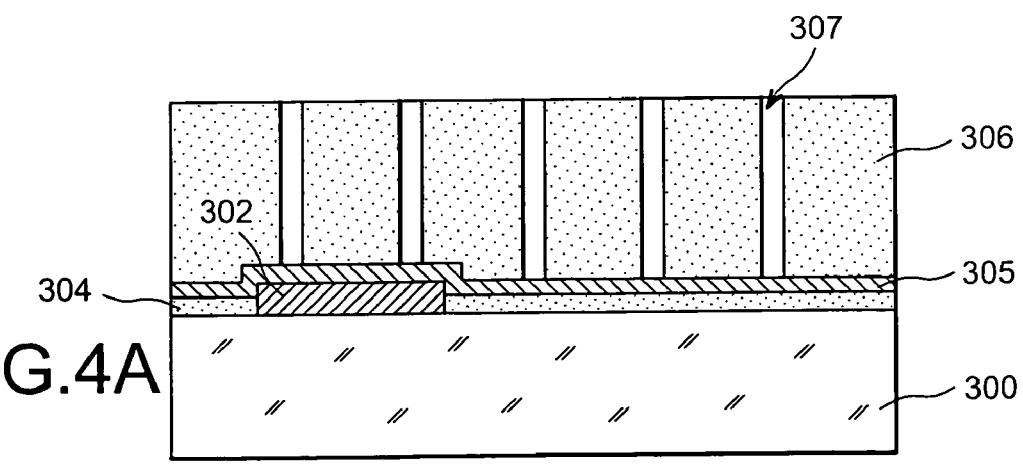
FIGS. 4A-4E represent advantageous alternative embodiments of production methods according to the invention.

The layer 306 is then revealed. It then comprises a set of transverse holes 307 revealing the conductive base 300 and wherein the distribution in the layer 306 depends on that of the mask patterns. This distribution may be uniform. For example, the holes 307 may be of the order of 3 micrometers in diameter and may be separated by an interval of 6 micrometers (FIG. 4A).

Etching of the conductive base 305 via the holes 307 is then performed, so as to extend the holes. After the conductive base has been etched, some holes referenced 307a from all the holes 307 reveal the passivation layer 304, some others referenced 307b reveal the conductive blocks 302.

Figure 4B:
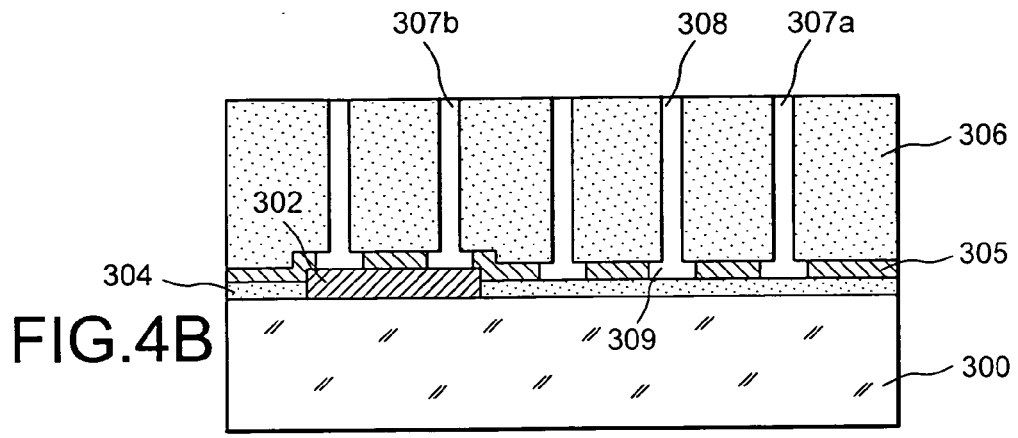

The conductive base 305 may be over-etched so that the holes 307 each comprise a first part referenced 308 located on the layer 306 and a second part referenced 309 with an enlarged base, in the extension of the first part 308 (FIG. 4B).

The holes 307 are then filled by means of electrolytic growth of metal such as copper, nickel, titanium, tungsten, SnPb alloy, gold, etc. using the conductive base 301 as an electrode. The holes 307b revealing the conductive blocks 302 are preferentially filled from their base to the surface of the layer 306 so as to form conductive rods 310. At the same time, given the nature of their base, the holes 307a revealing the passivation layer 304 are generally subject to less and slower filling than the holes 307b.

Figure 4C:
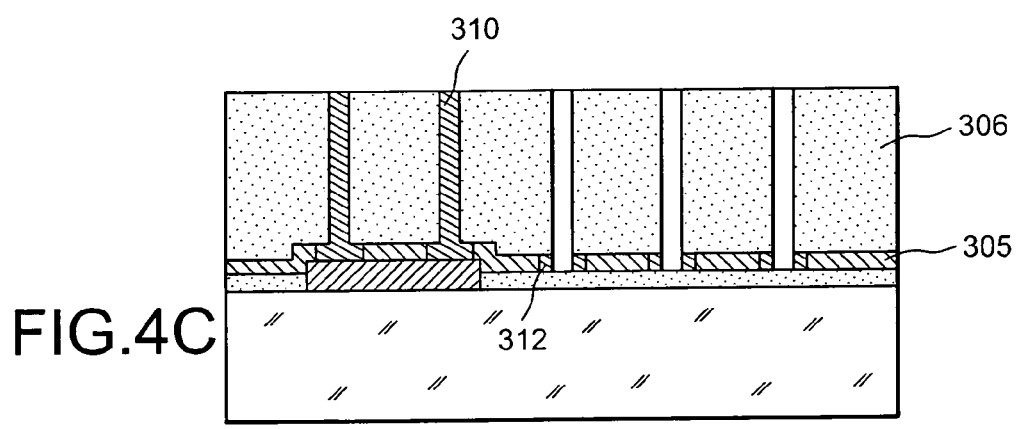

So-called "parasitic" conductive rods generally much smaller in size than the rods 310 or "parasitic" deposits 312 may be formed in the holes 307a (FIG. 4C). The adherence of this "parasitic" rods or deposits 312 will generally be low.

According to an alternative embodiment, the method may also comprise after the filling of the holes 307, a noble metal-based chemical deposition step on the conductive rods 310. This noble metal-based anelectrolytic coating/autocatalytic deposition step on the conductive rods 310 may make it possible to improve the overall conductance thereof.

Figure 4D:
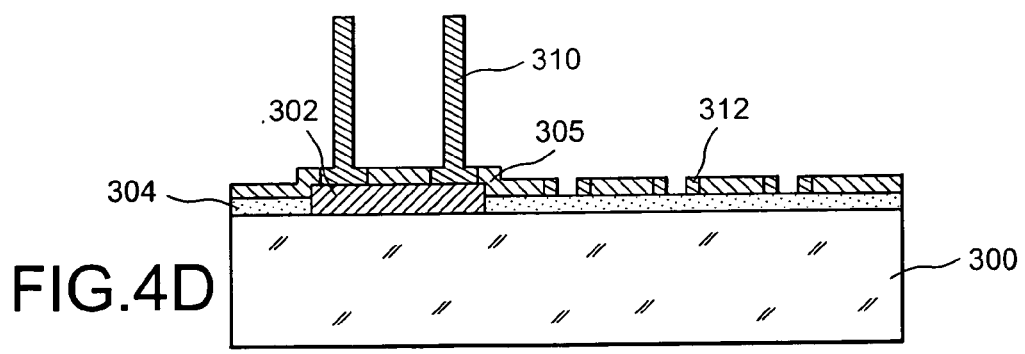

The layer 306 is then removed by means of a stripping method, for example using a solvent such as acetone. At least some of the low-adherence "parasitic" deposits with respect to the passivation layer 304 then disappear at least partially (FIG. 4D).

Figure 4E:
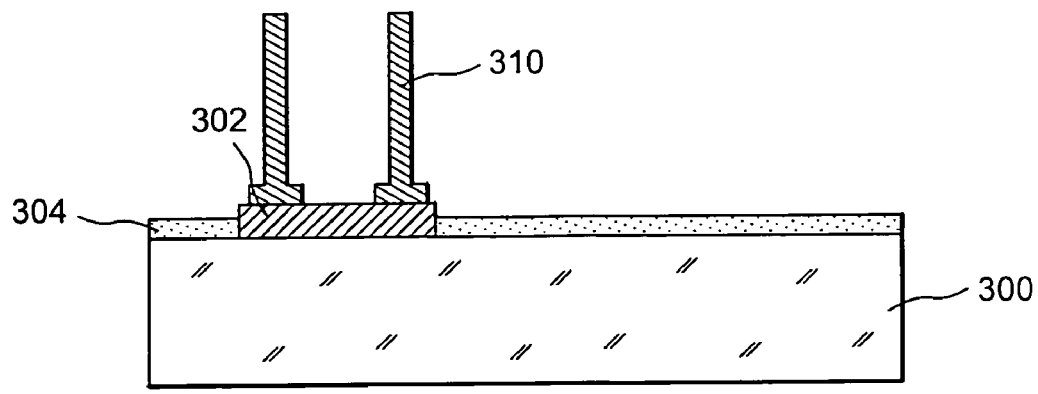

Finally, the conductive base 305 is removed by means of a suitable cleaning method. If the conductive base 305 is formed from a stack of a titanium-based layer and a copper-based layer, the cleaning method may comprise a removal step of the titanium-based layer, for example using a first bath with an ammonia and hydrogen peroxide base, and another copper-based layer removal step, for example using a second bath with a hydrofluoric acid base. This cleaning method may be completed by a "lift-off" type method. Any "parasitic" rods or "parasitic" deposits then disappear completely (FIG. 4E).

The microelectronic device obtained in this way using the method described above is formed from a chip 300 comprising conductive blocks 302 inserted in a passivation layer 304. On each of the conductive blocks 302, a plurality of conductive rods are located, displaying a non-zero angle with the main plane of the chip.

Figure 5:
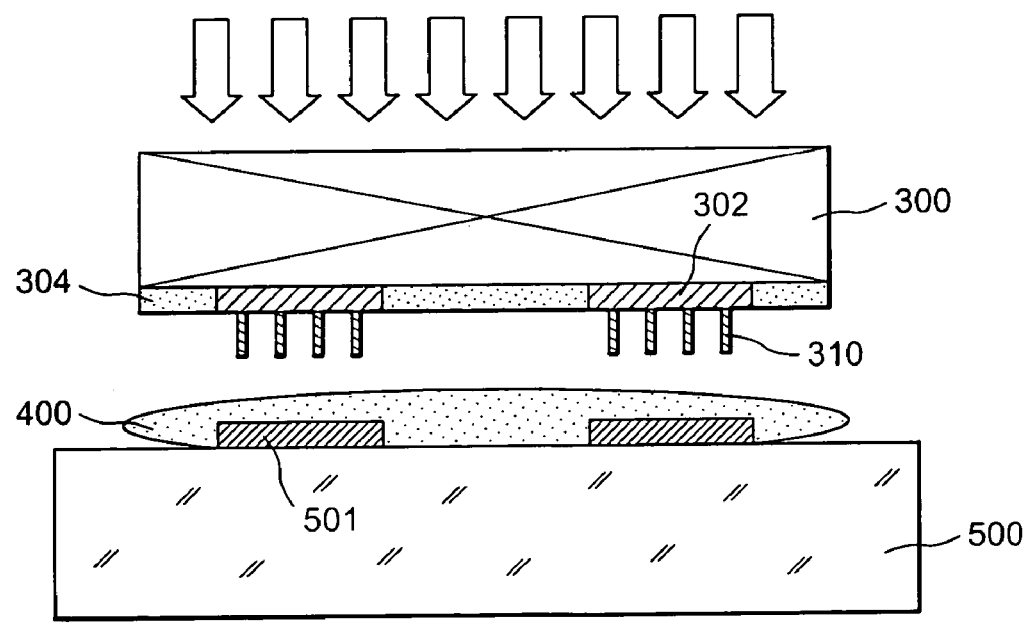
FIG. 5 represents the assembly of a microelectronic device according to the invention with an interconnection substrate.

FIG. 5 illustrates the assembly between the chip 300 and an interconnection substrate 500.

The chip 300 comprises conductive rods 310 formed using the method described above and localised on its conductive blocks 302.

The conductive blocks of the chip 300 and the connection blocks 501 of the interconnection substrate 500 are arranged opposite each other. The substrate 500 is coated with adhesive 400 with a view to being assembled with the chip 300.

After assembly, the electrical connection between the substrate 500 and the chip 300 will be carried out using an interconnection technique used according to the invention. This technique makes it possible to assemble components comprising significant surface evenness defects when said components are equipped with localised conductive rods rather than coated with an anisotropic conductive film such as that described in the prior art. In addition, the use of conductive rods localised only on component blocks makes it possible to protect any sensitive zones located on said component or on another component with which said component is liable to be assembled.

A method according to the invention to produce conductive rods on an electronic component equipped with one or more conductive blocks involves at least one conductive base insulation step, excluding zones located opposite the conductive blocks.

For example, this insulation comprises the creation of holes in a masking layer deposited on the conductive base, only opposite or above the blocks (FIG. 2C).

According to another example, this insulation involves the creation of a thin insulating layer that is etched above the blocks (FIG. 3A).

According to a third example, this insulation involves etching of the conductive base via the holes of a masking layer, prior to the filling of these holes with a conductive material (FIG. 4B).

The invention claimed is:

1. A method to produce conductive rods on an electronic component comprising one or more conductive blocks, each of the conductive rods being in at least partial contact with a block of the electronic component, the method comprising:
    deposition of a conductive base on the component;
    deposition of a masking layer on the conductive base;
    formation in the masking layer of a plurality of holes, at least one conductive block of the conductive blocks being located opposite one or more holes, at least one hole of the holes having none of the conductive blocks opposite it;
    etching the conductive base via the holes;
    filling of the holes with a conductive material base, by electrolysis and using the conductive base as an electrode, to form the conductive rods; and
    removal of the masking layer.

2. A method according to claim 1, the masking layer comprising at least one photosensitive polymer layer.

3. A method according to claim 1, wherein the conductive blocks are inserted in a passivation layer coating the electronic components.

4. A method according to claim 1, the conductive base being formed from a stack of at least two different conductive layers.

5. A method according to claim 1, further comprising, after the masking layer removal, an at least partial conductive base removal or selective conductive base etching.

6. A method according to claim 1, further comprising, after the filling by electrolysis, an additional noble metal-based chemical deposition on the conductive rods.

7. The method of claim 1, wherein the electronic component is a microelectronic device.

8. A method to produce conductive rods on an electronic component including one or more conductive blocks, each of the conductive rods being in at least partial contact with a block of the electronic component, the method comprising:
   deposition of a conductive base on the component;
   deposition of a thin insulating layer on the conductive base;
   formation of a plurality of openings in the thin insulating layer, each opening being located opposite a conductive block;
   deposition of a masking layer on the conductive base;
   formation in the masking layer of a plurality of holes, at least one conductive block of the conductive blocks being located opposite one or more holes, at least one hole of the holes having none of the conductive blocks opposite it;
   filling of the holes with a conductive material base, by electrolysis and using the conductive base as an electrode, to form the conductive rods; and
   removal of the masking layer.

9. A method according to claim 8, the masking layer comprising at least one photosensitive polymer layer.

10. A method according to claim 8, wherein the conductive blocks are inserted in a passivation layer coating the electronic components.

11. A method according to claim 8, the conductive base being formed from a stack of at least two different conductive layers.

12. A method according to claim 8, further comprising, after the masking layer removal, an at least partial conductive base removal or selective conductive base etching.

13. A method according to claim 8, further comprising, after the filling by electrolysis, an additional noble metal-based chemical deposition on the conductive rods.

14. The method of claim 8, wherein the electronic component is a microelectronic device.

15. A method according to claim 8, wherein, of the plurality of holes formed in the hole formation in the masking layer, some holes reveal the thin insulating layer, and some other holes reveal the conductive base.

* * * * *